(12) United States Patent
Renn et al.

(10) Patent No.: US 7,948,027 B1
(45) Date of Patent: May 24, 2011

(54) EMBEDDED BIT LINE STRUCTURE, FIELD EFFECT TRANSISTOR STRUCTURE WITH THE SAME AND METHOD OF FABRICATING THE SAME

(75) Inventors: Shing-Hwa Renn, Taoyuan County (TW); Cheng-Chih Huang, Taipei County (TW); Yung-Meng Huang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 54 days.

(21) Appl. No.: 12/635,662

(22) Filed: Dec. 10, 2009

(51) Int. Cl.
*H01L 29/76* (2006.01)

(52) U.S. Cl. . 257/329; 257/347; 257/349; 257/E27.112; 257/E29.262; 438/212

(58) Field of Classification Search .................. 257/329, 257/347, 349, E27.112, E29.262; 438/212
See application file for complete search history.

(56) References Cited

U.S. PATENT DOCUMENTS 7,518,182 B2 * 4/2009 Abbott et al. ................. 257/329

OTHER PUBLICATIONS

Kazumi Inoh, et al., "FBC (Floating Body Cell) for Embedded DRAM on SOI", 2003 Symposium on VLSI Technology Digest of Technical Papers, 2003.
Tomoaki Shino, et al., "Highly Scalable FBC (Floating Body Cell) with 25nm Box Structure for Embedded DRAM Applications", 2004 Symposium on VLSI Technology Digest of Technical Papers, 2004, pp. 132-133, IEEE.

* cited by examiner

*Primary Examiner* — Tu-Tu V Ho
(74) *Attorney, Agent, or Firm* — Winston Hsu; Scott Margo (57) ABSTRACT

An embedded bit line structure, in which, a substrate includes an insulator layer having an original top surface and a semiconductor layer on the original top surface of the insulator layer, and a bit line is disposed within the lower portion of the trench along one side of an active area. The bit line includes a first portion and a second portion. The first portion is located within the insulator layer and below the original top surface of the insulator layer. The second portion is disposed on the first portion to electrically connect the semiconductor layer of the active area. An insulator liner is disposed on the first portion of the bit line and between the second portion of the bit line and the semiconductor layer of the substrate opposite the active area for isolation. An STI is disposed within the trench to surround the active area for isolation.

18 Claims, 9 Drawing Sheets

EMBEDDED BIT LINE STRUCTURE, FIELD EFFECT TRANSISTOR STRUCTURE WITH THE SAME AND METHOD OF FABRICATING THE SAME

BACKGROUND OF THE INVENTION

1. Field of the Invention

The present invention relates to a semiconductor device, and particularly to an embedded bit line structure, a field effect transistor (FET) structure with the same and a method of fabricating the same.

2. Description of the Prior Art

A vertical Fin-shaped gate field effect transistor (FinFET) with an embedded (or buried) bit line is the mainstream to achieve next generation $4F^2$ (feature) cell because of simplified middle-of-line (MOL) process. However, front-end-of-line (FEOL) process becomes more complicated accordingly. Especially, shallow trench isolation (STI) with half feature size is required. As a result, an aspect ratio of STI larger than 20 happens for thirties nm generation, and difficulty for gap fill with oxide film could be an obstacle to dynamic random access memory (DRAM) shrinkage.

Vertical surrounding gate transistors (SGT) with embedded bit lines have been proposed with enlarging isolation rule (close to 1F (feature)) to greatly reduce STI manufacturing difficulty. However, $V_{th}$ (threshold voltage) stability for the memory cell array becomes much worse because of complicated fabricating process, including, for example, tedious embedded bit line formation steps, recess for spin-on-dielectric (SOD) formation steps, metal and n+ type poly defined transistor gate length. Reducing $V_{th}$ variation with longer channel length is also unfeasible under vertical dimension constraint.

Therefore, there is still a need for a novel FinFET structure and the fabrication process therefore to avoid the aforesaid problems.

SUMMARY OF THE INVENTION

An objective of the present invention is to provide an embedded bit line structure, an FET structure with the same and a method of fabricating the same, in which aspect ratio of STI can be relatively reduced and $V_{th}$ can be stable.

According to one embodiment of the present invention, an embedded bit line structure is provided, which includes a substrate including an active area, a trench surrounding the active area, and a bit line. The substrate includes an insulator layer having an original top surface and a semiconductor layer on the original top surface of the insulator layer. A bit line is disposed within the lower portion of the trench along one side of the active area. The bit line includes a first portion and a second portion. The first portion is located within the insulator layer and below the original top surface of the insulator layer. The second portion is disposed on the first portion to electrically connect the semiconductor layer of the active area. An insulator liner is disposed on the first portion of the bit line and between the second portion of the bit line and the semiconductor layer of the substrate opposite the active area for isolation. An STI is disposed within the trench to surround the active area for isolation.

According to another embodiment of the present invention, an FET structure with an embedded bit line, which includes a substrate including an active area, a trench, a bit line, and a word line. The FET structure includes a bit line structure similar to the aforesaid one. Additionally, an FET element is formed with the semiconductor layer of the active area. The bit line is disposed to electrically connect the FET. The word line is disposed within the substrate along another side of the active area, crosses over the bit line, and electrically connecting the FET.

According to further another embodiment of the present invention, a method of fabricating an embedded bit line structure is provided, which includes steps as follows. A substrate including an insulator layer having an original top surface and a semiconductor layer on the original top surface of the insulator layer is provided. An active area on the substrate is provided. A trench surrounding the active area and down through the semiconductor layer and into the insulator layer is formed, A first portion of a bit line is formed within the trench at one side of the active area, wherein the first portion of the bit line is below the original top surface of the insulator layer. An insulator liner is formed on a sidewall of the trench opposite the active area above the first portion of the bit line for isolating the bit line from the semiconductor layer of the substrate. A second portion of the bit line is formed on the first portion of the bit line within the trench to electrically connect the bit line to the semiconductor layer of the active area. The trench is filled with insulator material to form an STI.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
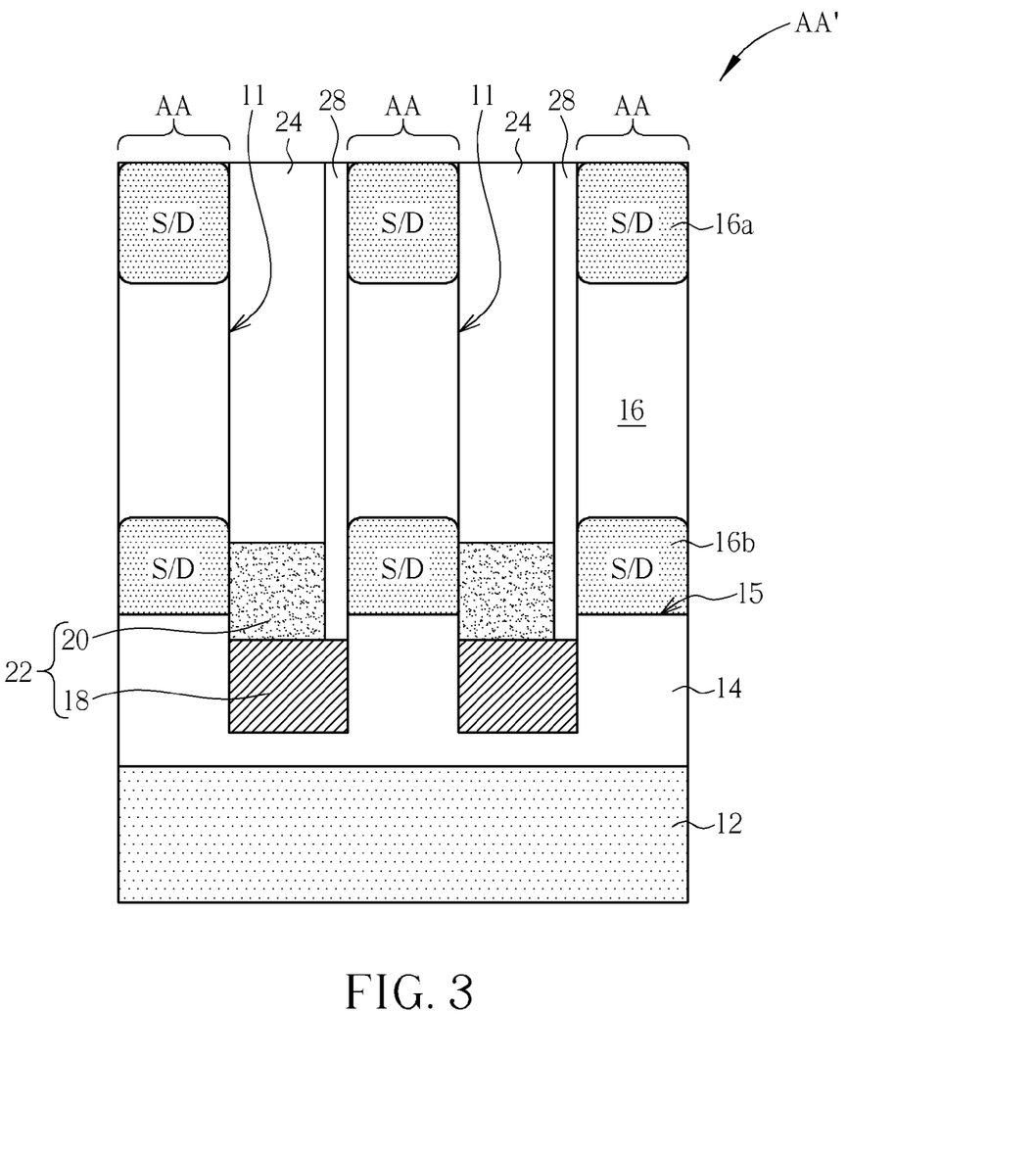
FIG. 3 is a schematic cross-sectional view of the FET structure with an embedded bit line shown in FIG. 2 taken along the line AA'.
Figure 4:
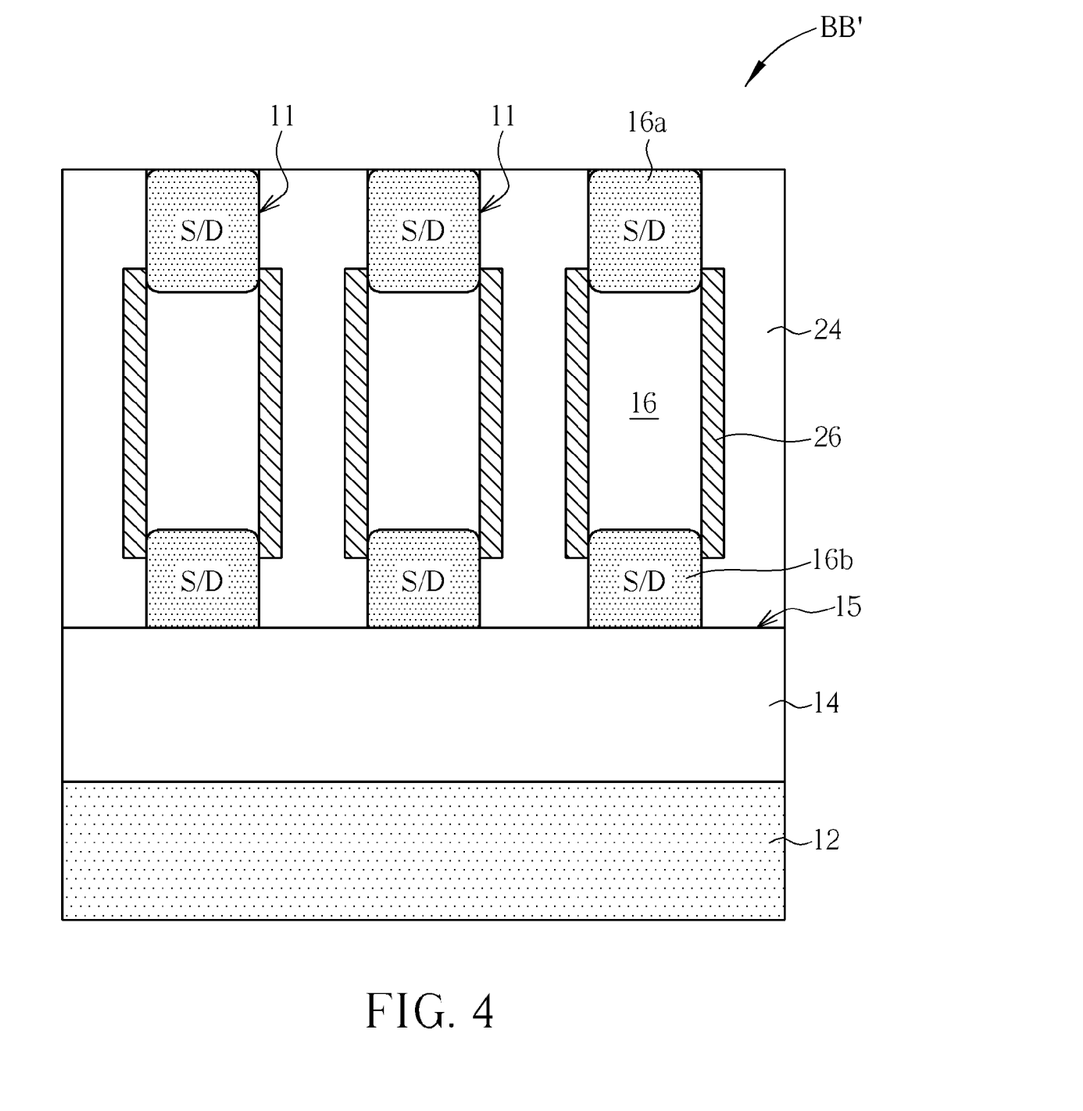
FIG. 4 is a schematic cross-sectional view of the FET structure with an embedded bit line shown in FIG. 2 taken along the line BB'.

An FET structure with an embedded bit line is provided in the present invention. The FET structure includes an embedded bit line structure according to the present invention, and both are described in detail, referring to FIGS. 1-4 showing an embodiment according to the present invention. A substrate 10 comprises an insulator layer 14, such as an oxide layer, and a semiconductor layer 16, such as a silicon layer, on the original top surface 15 of the insulator layer 14. Optionally, a silicon substrate 12 may be further beneath the insulator layer 14 for supporting the whole structure. For example, the substrate may be a silicon-on-insulator (SOI) one. At least an active area is defined on the substrate 10. A trench 11 is disposed to surround the active area (AA). A bit line 22 is disposed within the trench 11 along one side of the active area. The bit line 22 comprises a first portion 18 and a second portion 20. The first portion 18 is embedded within the insulator layer 14 and below the original top surface 15 of the insulator layer 14. The second portion 20 is disposed on the first portion 18 to electrically connect the semiconductor layer 16 of the active area. As shown in FIG. 3, an insulator liner 28 is disposed on the first portion 18 of the bit line 22 and between the second portion 20 of the bit line 22 and the semiconductor layer 16 of the substrate 10 opposite the active area for isolation. The insulator liner 28 and interlayer dielectric are not shown in some of the drawings, such as FIGS. 1 and 2, for clearly showing other elements. An STI 24 is disposed within the trench to surround the active area to insulate the active area from other part of the semiconductor layer of the substrate. Accordingly, the STI 24 may fill up the trench. The STI 24 may be downward through the semiconductor layer 16, partially go into the insulator layer 14, and partially stay on the bit line 22. As a result, the bit line 22 is embedded and insulated except the second portion 20 which electrically connect the active area. The first and second portions 18 and 20 may include conductive material, such as metal and polysilicon, respectively. It is preferred that the first portion 18 includes metal, and the second portion 20 includes polysilicon. The first portion 18 may be in a line shape, and the second portion 20 may be in a line shape or just a block shape for connecting the first portion 18 to the active area.

A word line 26 is disposed within the substrate 10, along another side of the active area, crossing over the bit line 22, and electrically connecting the gate (not shown) of FET.

Figure 1:
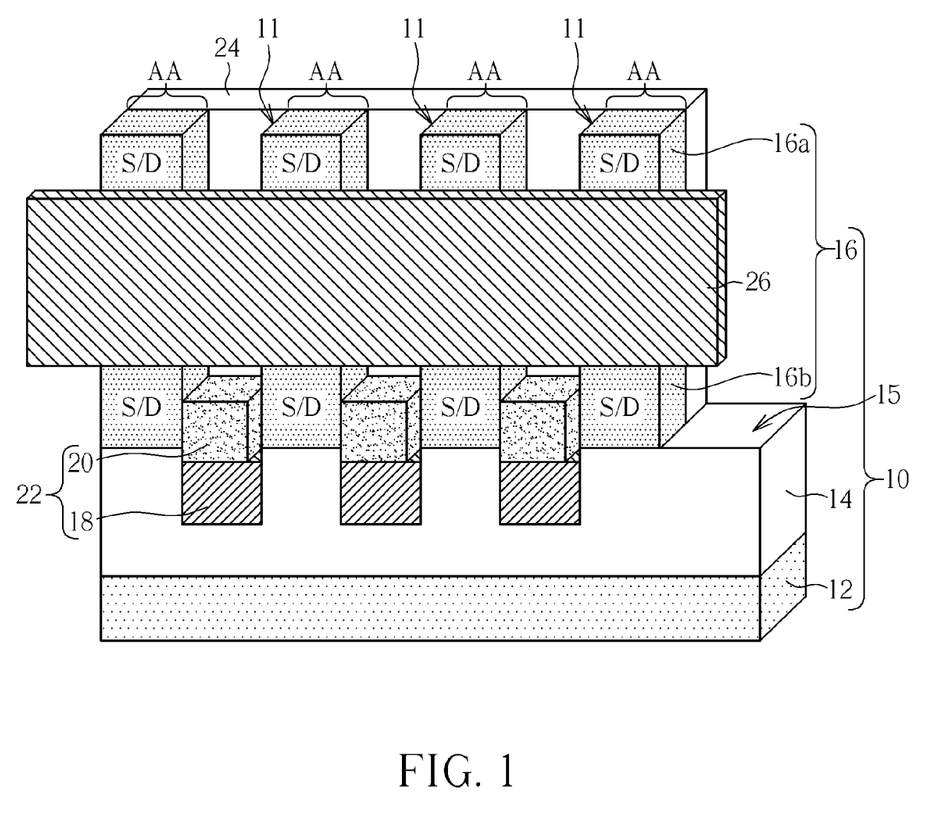
FIG. 1 is a schematic perspective view illustrating the FET structure with an embedded bit line according to one embodiment of the present invention.
Figure 2:
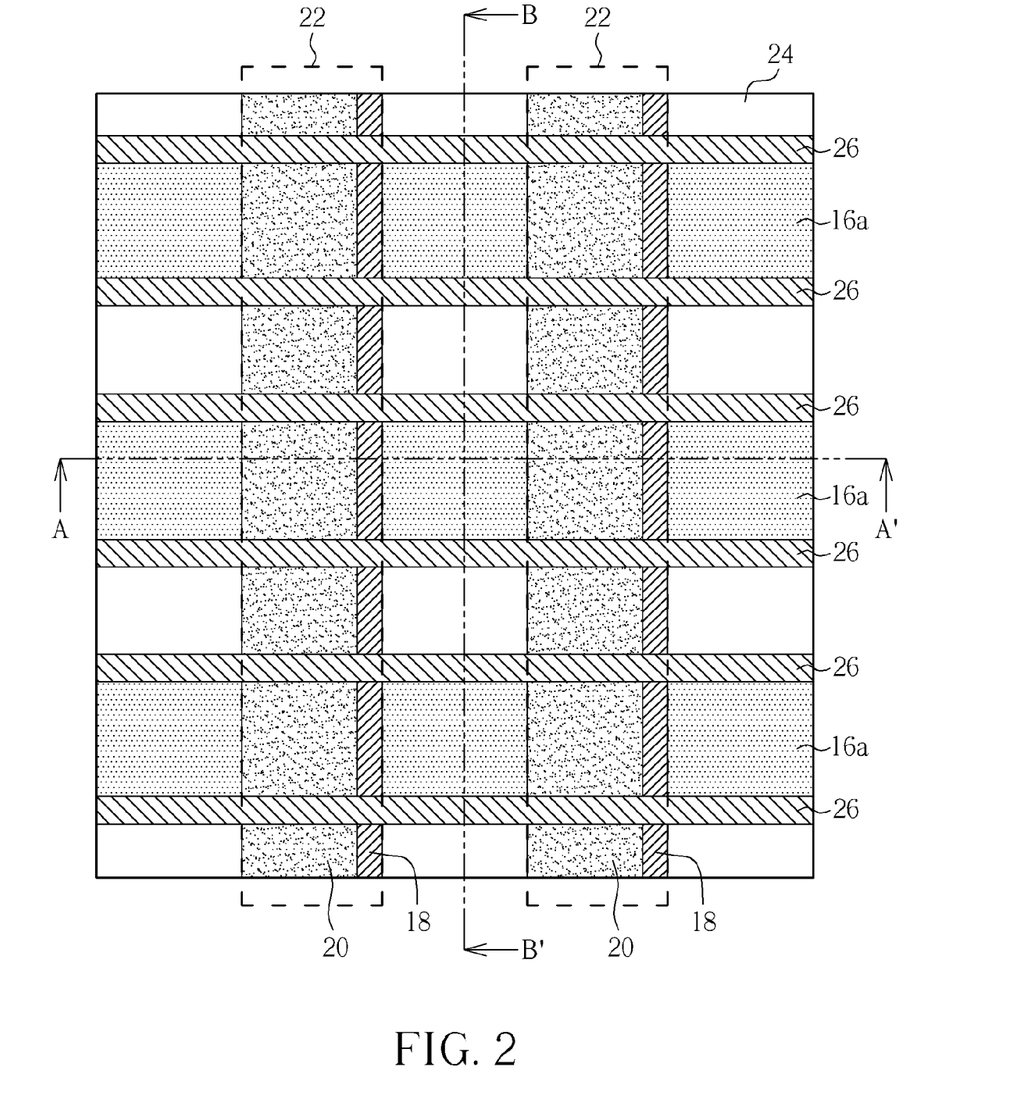
FIG. 2 is a schematic top view illustrating the FET structure with an embedded bit line shown in FIG. 1.

As shown in FIG. 1, the FET may comprise a pair of source/drain structures (S/D) 16a, 16b which may be disposed within the upper portion and the lower portion of the semiconductor layer of the active area respectively and a gate structure disposed between the source and the drain structures, as a vertical transistor.

Figure 5:
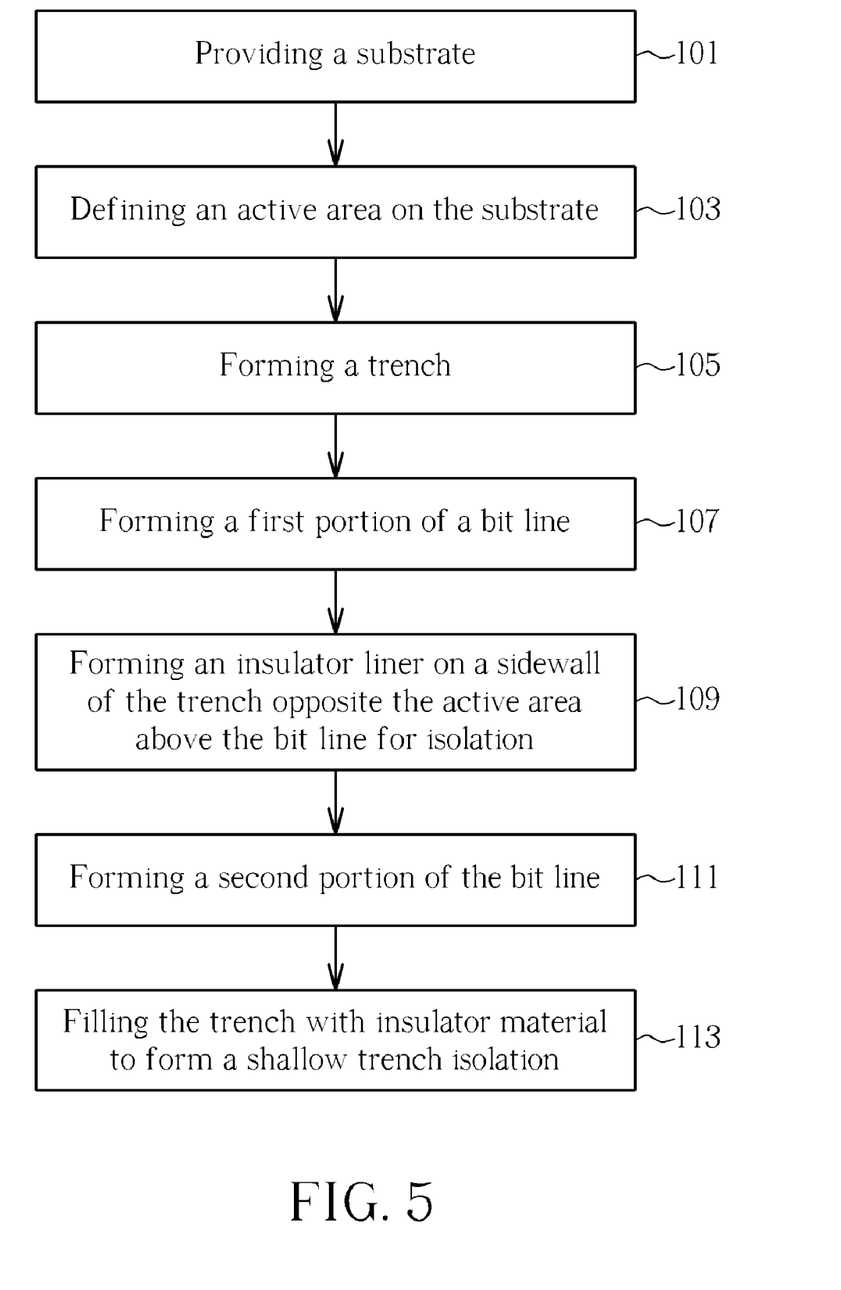
FIG. 5 is a flow chart illustrating a method of fabricating an embedded bit line according to an embodiment of the present invention.

According to further another embodiment of the present invention, a method of fabricating an embedded bit line structure is provided. One embodiment of the method is illustrated by a flow chart of FIG. 5 and schematic cross-sectional views of FIGS. 6-8. In the step 101, a substrate is provided. The substrate may include a silicon substrate 12, an insulator layer 14, and a semiconductor layer 16 aforesaid. In the step 103, an active area (AA) is defined on the substrate. In the step 105, a trench is formed to surround the active area and down through the semiconductor layer 16 and into the insulator layer 14 of the substrate. This may be accomplished by carrying out a microlithography process and an etching process using a patterned hard mask. Thereafter, in the step 107, a first portion 18 of a bit line is formed within the trench at one side of the active area. The first portion 18 of the bit line is formed to obtain a height at a position below the original top surface 15 of the insulator layer 14. In other word, the original top surface 15 of the insulator layer 14 is higher than the top surface of the first portion 18. When the first portion 18 includes metal, it may be formed by for example chemical vapor deposition to deposit a metal layer on the lower portion of the trench. A back etching may be required to control the height of the resulting metal layer.

Figure 6:
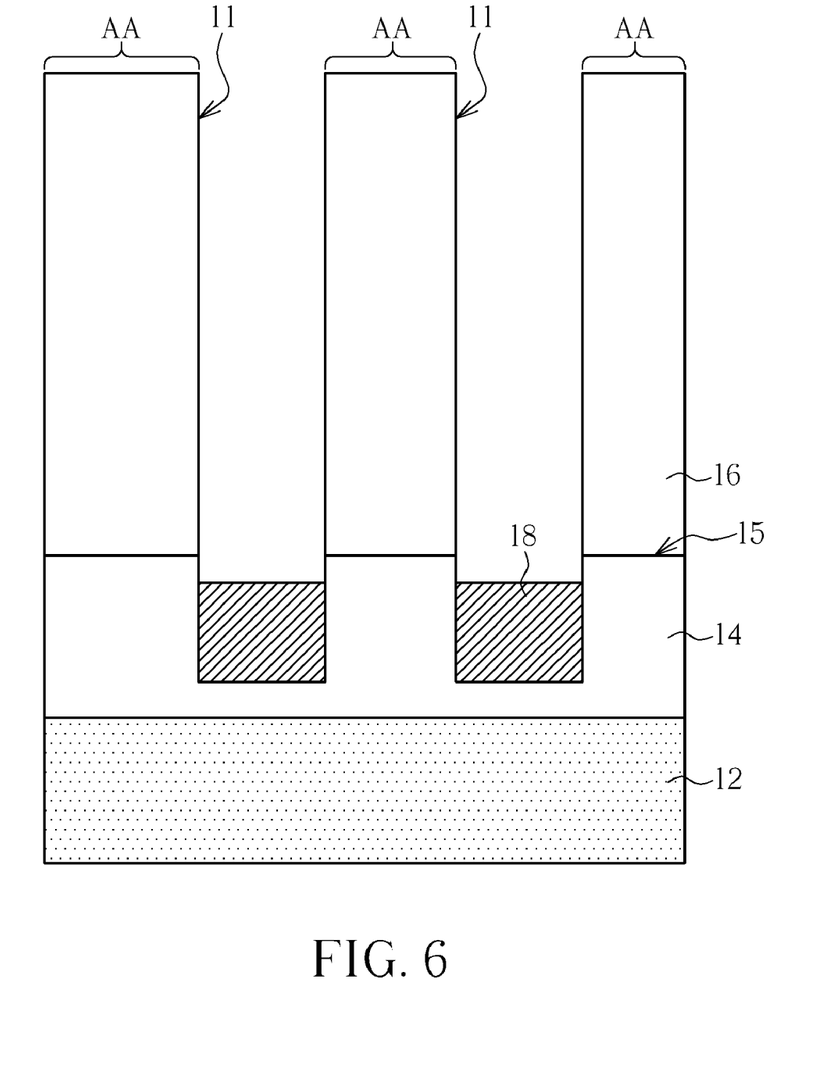
FIGS. 6-8 are schematic cross-sectional views illustrating a method of fabricating the embedded bit line structure according to an embodiment of the present invention.
Figure 7:
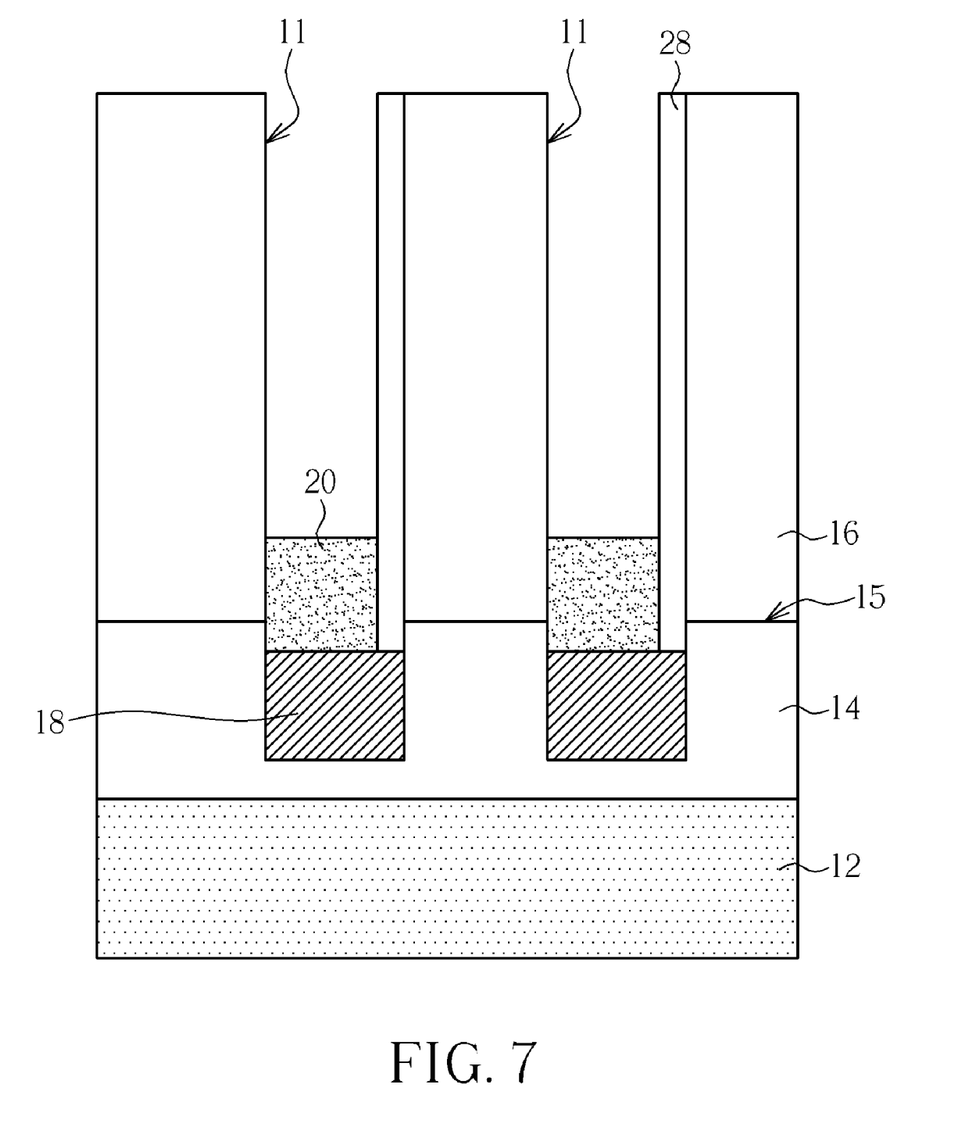
Figure 8:
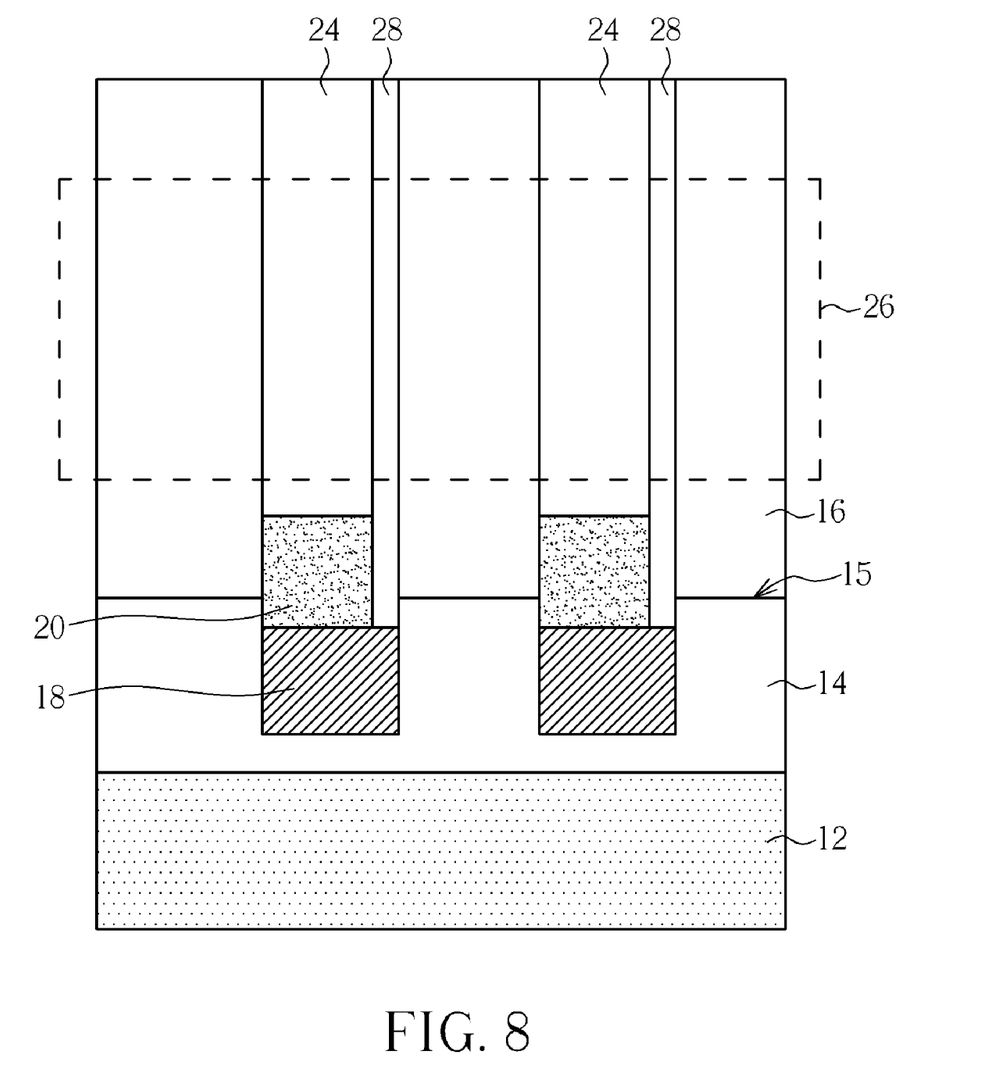

Thereafter, in the step 109, an insulator liner 28 is formed on a sidewall of the trench 11 opposite the active area above the first portion 18 of the bit line for isolating the bit line from the semiconductor layer 16 of the substrate. The formation of the insulator liner 28 may be carried out by forming an insulator liner on all of the sidewalls of the trench using for example a deposition process, followed by stripping off the insulator liner on the sidewall of the active area above the first portion 18 of the bit line using for example an etching process in which the desired portion is protected by a mask. In the step 111, a second portion 20 of the bit line is formed on the first portion 18 of the bit line within the trench 11 to electrically connect the bit line 22 to the semiconductor layer 16 of the active area. The second portion 20 may include polysilicon and may be formed by a chemical vapor deposition process. In the step 113, the trench is filled with insulator material, such as oxide material, by for example a chemical vapor deposition or spin-on-dielectric process to form an STI 24.

Also referring to FIGS. 1 and 8, a word line 26 may be further formed within the substrate along another side of the active area to cross over the bit line 22 and electrically connect the active area. The FET is formed at the active area. In an embodiment, the word line 26 may be formed within the substrate along another side of the active area to cross over the bit line 22 and connect the active area at a middle portion of the semiconductor layer 16 of the active area along a vertical direction, and implanting dopants, such as n-type dopants, into a lower portion and an upper portion of the semiconductor layer 16 of the active region at two sides of the middle portion to form a pair of source/drain regions 16a, 16b.

Figure 9:
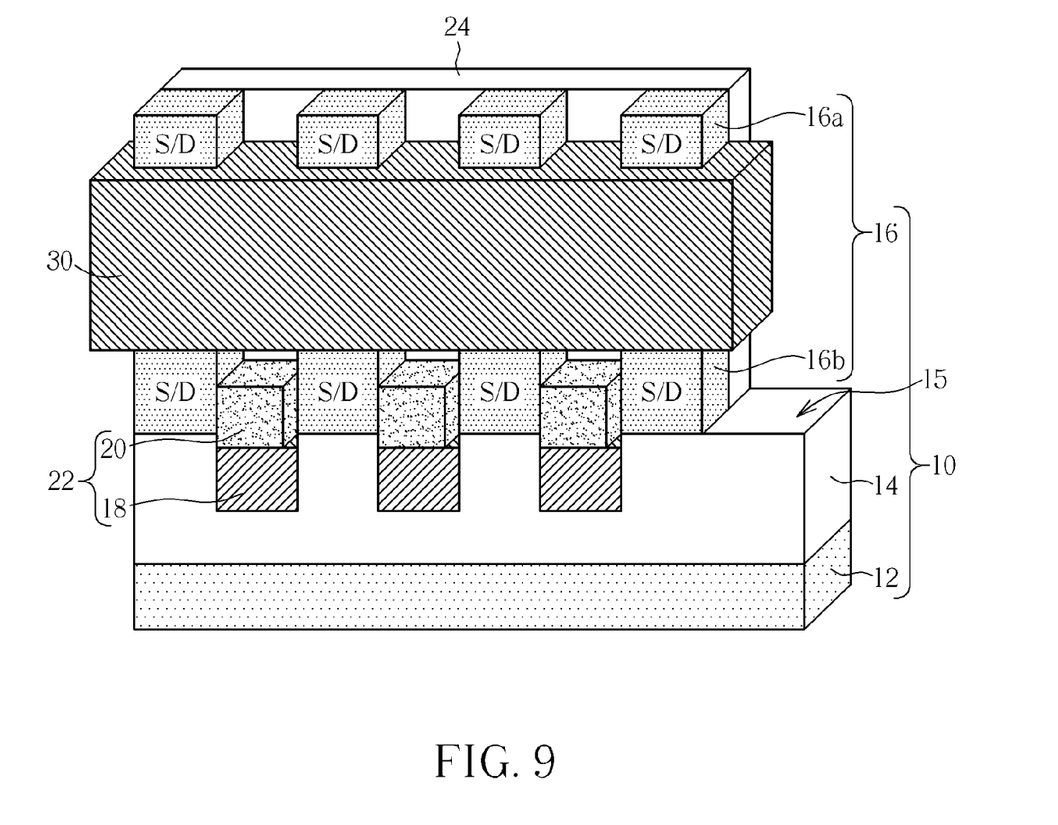
FIG. 9 is a schematic perspective view of an FET structure with an embedded bit line according to an embodiment of the present invention.

A conventional fin gate structure can be suitably formed based on the bit line structure of the present invention. The gate structure may comprise a fin gate structure, such as a double gate FinFET structure. Another word line may be further disposed, such that two word lines electrically connect two opposite sides of the fin gate structure respectively. Alternatively, referring to FIG. 9, the fin gate structure may be further a surrounding gate structure, and the word line 30 may be formed within the substrate to surround the surrounding gate and cross over the bit line 22.

The thickness of the semiconductor layer, such as silicon film, of the substrate depends on the resulting device desired and decided by vertical transistor geometric sizes including sizes of junction out-diffusion, channel length, STI format capability, and the like. As the semiconductor layer is disposed on the insulator layer, the bit line having a structure according to the present invention can be well insulated within the insulator layer and the STI, the thickness of the semiconductor layer can be significantly reduced as compared with conventional one.

Since the lower portion of the embedded bit line is formed within an insulator layer, parasitic capacitance is reduced. Since the FET is constructed on an insulator layer, the STI can be relatively shallow; and thus the fabrication is relatively easy. With easy STI fill process with embedded bit lines, longer channel is possible even for feature size of 40 nm or less, resulting in a stable array $V_{th}$. Furthermore, with embedded metal bit line structure, no metal contamination is risked.

Those skilled in the art will readily observe that numerous modifications and alterations of the device and method may be made while retaining the teachings of the invention.

What is claimed is:

1. An embedded bit line structure, comprising:
    a substrate comprising an insulator layer having an original top surface and a semiconductor layer on the original top surface of the insulator layer, wherein the substrate comprises an active area;
    a trench surrounding the active area and down through the semiconductor layer and into the insulator layer;
    a bit line disposed within a lower portion of the trench along one side of the active area, wherein the bit line comprises a first portion and a second portion, the first portion is located within the insulator layer and below the original top surface of the insulator layer, the second portion is disposed on the first portion to electrically connect the semiconductor layer of the active area;

an insulator liner disposed on the first portion of the bit line and between the second portion of the bit line and the semiconductor layer of the substrate opposite the active area for isolation; and a shallow trench isolation disposed within the trench to surround the active area for isolation.

2. The embedded bit line structure of claim 1, wherein the substrate comprises a silicon-on-insulator substrate.

3. A field effect transistor structure with an embedded bit line, comprising:

a substrate comprising an insulator layer having an original top surface and a semiconductor layer on the original top surface of the insulator layer, wherein the substrate comprises an active area, and the active area comprises a field effect transistor formed with the semiconductor layer;

a trench surrounding the active area and down through the semiconductor layer and into the insulator layer;

a bit line disposed within a lower portion of the trench along one side of the active area, wherein the bit line comprises a first portion and a second portion, the first portion is located within the insulator layer and below the original top surface of the insulator layer, the second portion is disposed on the first portion to electrically connect the field effect transistor;

an insulator liner disposed on the first portion of the bit line and between the second portion of the bit line and the semiconductor layer of the substrate opposite the active area for isolation;

a shallow trench isolation disposed within the trench to surround the active area for isolation; and a word line disposed within the substrate, along another side of the active area, crossing over the bit line, and electrically connecting the field effect transistor.

4. The field effect transistor structure with an embedded bit line of claim 3, wherein the substrate comprises a silicon-on-insulator substrate.

5. The field effect transistor structure with an embedded bit line of claim 3, wherein the field effect transistor comprises a pair of source/drain structures disposed within an upper portion and a lower portion of the semiconductor layer of the active area respectively and a gate structure between the source and the drain structures.

6. The field effect transistor structure with an embedded bit line of claim 5, wherein the gate structure comprises a fin gate structure.

7. The field effect transistor structure with an embedded bit line of claim 6, further comprising another word line, thereby two word lines electrically connecting two opposite sides of the fin gate structure respectively.

8. The field effect transistor structure with an embedded bit line of claim 5, wherein the gate structure comprises a surrounding gate structure.

9. The field effect transistor structure with an embedded bit line of claim 8, wherein the word line further surrounds the surrounding gate structure.

10. A method of fabricating an embedded bit line structure, comprising:

providing a substrate comprising an insulator layer having an original top surface and a semiconductor layer on the original top surface of the insulator layer;

defining an active area on the substrate;

forming a trench surrounding the active area and down through the semiconductor layer and into the insulator layer;

forming a first portion of a bit line within a lower portion of the trench along one side of the active area, wherein the first portion of the bit line is below the original top surface of the insulator layer;

forming an insulator liner on a sidewall of the trench opposite the active area above the first portion of the bit line for isolating the bit line from the semiconductor layer of the substrate;

forming a second portion of the bit line on the first portion of the bit line within the trench to electrically connect the bit line to the semiconductor layer of the active area; and filling the trench with insulator material to form a shallow trench isolation.

11. The method of fabricating an embedded bit line structure of claim 10, wherein the substrate comprises a silicon-on-insulator substrate.

12. The method of fabricating an embedded bit line structure of claim 10, further comprising forming a word line within the substrate along another side of the active area to cross over the bit line and connect the active area.

13. The method of fabricating an embedded bit line structure of claim 12, further comprising forming a field effect transistor at the active area.

14. The method of fabricating an embedded bit line structure of claim 10, further comprising forming a word line within the substrate along another side of the active area to cross over the bit line and connect a middle portion of the semiconductor layer of the active area, and implanting dopants into a lower portion and an upper portion of the semiconductor layer of the active region at two sides of the middle portion to form a pair of source/drain regions.

15. The method of fabricating an embedded bit line structure of claim 10, further comprising:

forming a field effect transistor at the active area, wherein the field effect transistor comprises a fin gate and a pair of source and drain regions; and forming a word line within the substrate along another side of the active area to cross over the bit line and electrically connect the fin gate.

16. The method of fabricating an embedded bit line structure of claim 10, further comprising:

forming a field effect transistor at the active area, wherein the field effect transistor comprises a surrounding gate and a pair of source and drain regions; and forming a word line within the substrate, wherein the word line surrounds the surrounding gate and cross over the bit line.

17. The method of fabricating an embedded bit line structure of claim 10, wherein, the step of forming an insulator liner on a sidewall of the trench opposite the active area above the bit line is carried out by:

forming an insulator liner on all of the sidewalls of the trench, and thereafter stripping off the insulator liner on the sidewall of the active area above the first portion of the bit line.

18. The method of fabricating an embedded bit line structure of claim 10, wherein, the step of filling the trench with insulator material to form a shallow trench isolation is performed by a spin-on-dielectric process.

* * * * *